United States Patent [19]

Gee et al.

[11] Patent Number: 4,624,736
[45] Date of Patent: Nov. 25, 1986

[54] LASER/PLASMA CHEMICAL PROCESSING OF SUBSTRATES

[75] Inventors: James M. Gee; Philip J. Hargis, Jr., both of Albuquerque, N. Mex.

[73] Assignee: The United States of America as represented by the United States Department of Energy, Washington, D.C.

[21] Appl. No.: 634,001

[22] Filed: Jul. 24, 1984

[51] Int. Cl.$^4$ ............... H01L 21/306; B44C 1/22; C03C 15/00; C23F 1/02

[52] U.S. Cl. ............... 156/643; 118/50.1; 118/620; 118/728; 156/345; 156/635; 156/646; 156/654; 204/192.3; 204/298; 219/121 LJ; 219/121 LM; 427/38; 427/53.1; 427/54.1

[58] Field of Search ............... 118/728, 50.1, 620; 427/38, 39, 53.1, 54.1, 86; 156/345, 643, 646, 635, 654–657; 204/164, 192 EC, 192 E, 298; 219/121 PD–121 PG, 121 LH, 121 LJ, 121 LM, 121 EE, 121 EK, 121 EM, 121 PU, 121 PY

[56] References Cited

U.S. PATENT DOCUMENTS

| 4,183,780 | 1/1980 | McKenna et al. | 156/643 |
| 4,192,706 | 3/1980 | Horiike | 156/643 |
| 4,198,261 | 4/1980 | Busta et al. | 156/626 |
| 4,281,030 | 7/1981 | Silfvast | 427/42 |
| 4,478,677 | 10/1984 | Chen et al. | 156/635 |

FOREIGN PATENT DOCUMENTS 0118636 9/1980 Japan ............... 156/643

OTHER PUBLICATIONS

R. Solanki et al., "Applied Physics Letters", 38(7), Apr. 1, 1981, Laser Photodeposition of Refractory Metals, pp. 572–574.

N. Ianno et al., "Applied Physics Letters", 39(8), Oct. 15, 1981, Plama Annealing of Ion Implanted Semiconductors, pp. 622–624.

R. W. Andreatta et al., "Applied Physics Letters", 40(2), Jan. 15, 1982, Low-Temperature Growth of Polycrystalline Si and Ge Films by Ultraviolet Laser Photodissociation of Silane & Germane, pp. 183–185.

P. K. Boyer et al., "Applied Physics Letters", 40(8), Apr. 15, 1982, Laser-Induced Chemical Vapor Deposition of SiO2, pp. 716–719.

*Primary Examiner*—William A. Powell
*Attorney, Agent, or Firm*—George H. Libman; Albert Sopp; Judson R. Hightower

[57] ABSTRACT

A process for the modification of substrate surfaces is described, wherein etching or deposition at a surface occurs only in the presence of both reactive species and a directed beam of coherent light.

27 Claims, 10 Drawing Figures

DEPOSITION/ETCH DEPENDENCE ON LASER ENERGY

FIG. 6

RAMAN SPECTRUM OF I MICRON THICK CRYSTALLINE SILICON FILM DEPOSITED UPON <100> SILICON SUBSTRATES AT A LASER FLUENCE OF ABOUT 0.25 J/cm²

LASER/PLASMA CHEMICAL PROCESSING OF SUBSTRATES

BACKGROUND OF THE INVENTION

The present invention relates to a method for modifying the surface of a substrate by laser irradiation in the presence of reactive species. The present invention further relates to an apparatus for carrying out the aforementioned method.

Etching techniques are known in the art that involve selective removal of materials by a reaction with chemically active gases created by a radio frequency (RF) power-induced glow discharge maintained in the etching chamber. In such a "plasma etching" process, chemically reactive gases such as $CF_4$, are generally used. The surface of the substrate to be etched is covered with a mask leaving the selected areas of the substrate exposed. The substrate to be etched is then inserted into a chamber containing the reactive gas. To create the plasma, an RF voltage may be applied across the gas to cause the gas to dissoicate and form various species comprising positive and negative ions, reactive atoms such as fluorine, and radicals. The plasma then reacts with the surface and forms volatile products, thereby leaving an etched surface in the areas exposed by the mask. It is also known that by changing the gas and other reaction conditions, a plasma can be used for deposition of a layer on a substrate rather than etching.

In a paper entitled "Plasma Annealing of Ion Implanted Semiconductors," *Appl. Phys. Lett.*, 39:622–24 (1981), Ianno et al. disclose the use of a plasma-generated electron beam to anneal damaged semiconductors. The apparatus used by Ianno et al. comprises a four-inch inside diameter pyrex cross with a planar aluminum cathode, a stainless steel ring anode and a vertically arranged magnetic lens. One side port of the cross operates as the gas inlet and the opposing side port is used to introduce a sample holder. A glow discharge is maintained between the cathode and the ring anode, and Ianno et al report that the cathode, when constantly bombarded by photons, ions, metastable molecules and other excited species, emits electrons which are accelerated toward the negative glow of the discharge in the direction of the ring anode. A significant fraction of these electrons are focused by the magnetic lens to generate an electron beam with sufficient energy to penetrate an implanted substrate deep enough to ensure good crystal regrowth.

It is also known in the art to use a laser as the sole energy source to decompose, either pyrolytically or photolytically, precursor gases which contain halogen atoms, thereby producing reactive species which can etch the surface of a substrate. Gas pressures greater than 1 torr were generally required in order to achieve reasonable etch rates with this technique.

In a paper entitled "Laser Enhanced Chemical Etching of Solid Surfaces," *IBM J. Res. Develop.* 26:145–50 (1982), Chuang discloses the etching of, inter alia, Si and $SiO_2$ films by halogen-containing gases wherein a laser is used to provide the energy to excite molecules into higher vibrational states, thereby enhancing the process of dissociative chemisorption and subsequent surface reactions to form volatile products. As an alternative mechanism, it is proposed that the excitation of gas molecules create reactive radicals which become involved in surface reactions. Laser enhanced chemical etching of silicon and silicon dioxide with pulsed $CO_2$ and continuous argon lasers was investigated.

Lasers have also been used to deposit materials like silicon dioxide on substrate surfaces. For example, Boyer et al disclose a laser-induced photochemical deposition of silicon dioxide from gas phase donor molecules at a rate of up to 3,000 angstroms per minute. "Laser-Induced Chemical Vapor Deposition of Silicon Dioxide," *Appl. Phys. Lett.* 40: 716–19 (1982). According to Boyer et al., gas phase $SiH_4$ and $N_2O$ molecules were excited and dissociated by means of an argon fluoride laser operated at 193 nm. Deposition of nearly stoichiometric $SiO_2$ was achieved at low temperatures by way of direct photolytic reaction of the $N_2O$ and $SiH_4$ using a coherent beam of photons from the argon fluoride excimer laser.

In the paper entitled "Low-Temperature Growth of Polycrystalline Silicon and Germanium Films by Ultraviolet Laser Photo-Dissociation of Silane and Germane," *Appl. Phys. Lett.* 40: 183–85 (1982), Andraetta et al disclose the growth of polycrystalline silicon and germanium films on amorphous silicon dioxide substrates. The disclosed process is said to occur through the photodissociation of silane/nitrogen or germane/helium mixtures using a pulse excimer laser. In particular, an argon fluoride laser was operated at 193 nm and a krypton fluoride laser operated at 248 nm. Typically, a repetition frequency of 20 hertz was used, with the laser beam being focused at a point from about 1–4 centimeters in front of the growth chamber using a 7 centimeter focal length quartz lens. The experiments were conducted under a total pressure of 450 torr and it was determined that for silicon and germanium the film growth rate strongly depended upon laser wavelength and intensity.

R. Solankyi discloses the deposition of the refractory metals chromium, molybdenum, and tungsten via laser-induced gas phase photolysis of the respective metallic hexacarbonyls. "Laser Photo-Deposition of Refractory Metals," *Appl. Phys. Lett.* 38: 572–74 (1981).

U.S. Pat. No. 4,281,030 teaches the implantation of a source material into a target by way of a laser-produced particle flux. The application of laser radiation to a source material produces a stream of ions which flows outward from the source material and deposits a film of the material onto a collector substrate surface which is disposed in the path of the ion flux. The implantation of a source material into the target is said to be enhanced if the target substrate is first softened by way of an incident laser radiation.

Both laser-based and plasma-based processing methods present significant disadvantages. As previously noted, etching techniques relying on laser irradiation alone require the use of halogen-containing gas at relatively high pressures. Also, laser chemical etching is slower than conventional plasma etching in many cases, particularly in terms of the total amount of material to be processed in a given period of time. Plasma etching or deposition, on the other hand, is much harder to control, since surface modification can proceed, in a nonselective manner, where ever the plasma comes in contact with the substrate surface. In addition, plasma-induced modification is often accompanied by radiation damage to the substrate.

U.S. Pat. No. 4,183,780 teaches the use of vacuum ultraviolet light to control a process involving plasma etching and deposition. In accordance with the disclosed process, vacuum ultraviolet radiation (600 to 1,000 angstroms, or below 200 nm) is directed toward and absorbed by the plasma species disposed adjacent a substrate, which may be a silicon wafer that carries a silicon dioxide layer to be selectively etched. Both the plasma etching and deposition processes can be controlled on a real time basis by turning the vacuum ultraviolet light source on or off. Preferred plasma species for reactive ion etching comprise $O_2$, $F_2$, and stable organic halides such as $CF_4$ which require wavelengths in the vacuum ultraviolet range for photoionization and dissociation. Deposition of the plasma species similarly requires that the incident radiation be in the vacuum ultraviolet region of the electromagnetic spectrum. Also, the disclosed process involves contact between the plasma and the substrate, and thus suffers the drawbacks of conventional plasma processing.

SUMMARY OF THE INVENTION

It is therefore an object of the present invention to provide a method for the modification of substrate surfaces which does not require contact between the surfaces to be modified and a plasma.

It is another object of the present invention to provide a method for etching and depositing which requires neither high pressures of precursor gasses nor a source of vacuum ultraviolet light.

It is a further object of the present invention to provide a surface-modification technique of superior precision which permits deposition or etching at much higher rates than conventional processes.

It is yet another object of the present invention to provide an apparatus for processing substrates without the above-summarized drawbacks of currently available etching and deposition technology.

In accomplishing the foregoing objects there has been provided, in accordance with one aspect of the present invention, a process for modifying a surface of a substrate, comprising the steps of (a) generating radical species of a defined source; (b) allowing the radical species to diffuse to a substrate which is remote from the defined source; and (c) in the presence of the radical species, contacting at least a portion of the surface substrate with a beam of coherent light having a predetermined intensity, whereby the surface undergoes modification only in the portion contacted by the beam. In one preferred embodiment, the defined source of reactive species comprises a glow discharge plasma.

In accordance with another aspect of the present invention, there has been provided an apparatus for modifying a surface of a substrate, comprising (a) generating means for generating reactive species; (b) irradiating means for producing and directing a beam of coherent light; (c) holding means for holding a substrate such that the substrate is remote from the generating means but accessible to the beam of coherent light; and (d) conduit means for allowing diffusion of the reactive species from the generating means to the substrate. In a preferred embodiment, the aforementioned generating means comprises (i) a reaction space containing at least one gas, (ii) means for introducing and removing gas from the reaction space, and (iii) a cathode and at least one anode arranged such that a voltage potential can be imposed across at least a portion of the reaction space of sufficient magnitude to ionize the gas. In another preferred embodiment, the generating means comprises (i) a reaction space containing at least one gas, (ii) means for introducing and removing gas from the reaction space, and (iii) means for inducing a magnetic field in at least a portion of the reaction space of sufficient magnitude such that the gas is heated to form a plasma.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description. It is also understood that incoherent light of sufficient intensity would suffice.

DETAILED DESCRIPTION OF PREFERRED EMBODIMENTS

The present invention provides a materials processing technique wherein both a plasma and a laser are simultaneously used in depositing or etching a substrate surface. Although various plasma-based and laser-based processing techniques are known in the art, they have, to applicants' knowledge, never been combined in the manner hereinafter disclosed.

In accordance with a preferred embodiment of the present invention, reactive species, such as radicals, ions and excited-state, metastable molecules, are produced by a suitable source, for example, a high-voltage DC glow discharge or a radio-frequency (RF) discharge, and then allowed to diffuse from the source to a remote substrate. At the substrate surface, a beam from a laser emitting coherent light is focused, resulting in modification (etching and/or deposition) of the substrate surface only in the area outlined by the laser beam, i.e., surface modification occurs only where both the reactive species are present and the laser is shining.

Thus, an important feature of the present invention is the physical separation of the reactive species-generating process from the reaction(s) induced by the laser beam at the substrate surface. Separation of species generation from the substrate in accordance with the present invention results in the plasma's having less effect upon the surface modification process, thus making the process easier to control. In addition, separation of substrate from species generation eliminates the problem of radiation damage to the substrate, a major drawback to conventional processing that relies on plasma-to-substrate contact.

The chemical reactions underlying modification of the substrate surface pursuant to the present invention are not now known. While the present invention is not limited to a speculated reaction mechanism, it is thought that the reactive species diffuse to the substrate, where they are absorbed. When silane is the precursor gas, the resulting adlayer presumably is a-Si:H, which is known to be deposited in a silane glow discharge. Amorphous hydrogenated silicon films are also known to have very large absorption coefficients in the UV range, on the order of $10^6$ cm$^{-1}$. Hence, the adlayer is expected to strongly absorb the incident laser radiation and may then react either to deposit silicon or to remove substrate material.

In any case, it has been found that the combination of reactive species from a source remote to a substrate and the laser beam impinging on selected portions of the substrate surface effects a two- to three- fold increase in deposition or etching rate compared to conventional, laser-induced processing techniques. Moreover, the surface-modification method of the present invention is flexible, requiring neither a high vacuum, halogen-containing gas, nor light restricted to the ultraviolet spectral range.

Further adaptability is provided by the fact that the present invention can be applied to the modification of various substrates, using a wide range of precursor gasses to produce the reactive species. Precursor gasses which are suitable for the present invention include the following:

$WF_6$ and $H_2$ for depositon of tungsten;
$SiH_4$ and $N_2O$ or $O_2$ for deposition of $SiO_2$;
$SiH_4$ and $NH_3$ or $N_2$ for deposition of $Si_3N_4$;
gaseous organometallic compounds for deposition of Al or GaAs; gaseous fluorocarbons (such as $CF_4$ or $CF_3H$) for etching of Si or $SiO_2$; and $Cl_2$ for etching of the Al or GaAs.

As previously indicated, there are no particular limitations on the source for reactive species in the present invention. A DC glow discharge in the 10 kV range can be used. Alternatively, an RF discharge generated, for example, as an inductively coupled plasma, or with a planar diode reactor, is suitable. An inductively coupled plasma offers the advantage of eliminating direct contact between the electrodes and the plasma, thereby avoiding contamination of the plasma by sputtering of the electrodes. A third alternative for generation of reactive species within the present invention involves the use of a laser or an electron beam to irradiate a suitable material and thereby produce reactive species which, in turn, participate in surface reactions induced by another laser directed at the substrate to be processed.

Isolation from the substrate of the source for reactive species can be accomplished by various means within the scope of ordinary skill. As set out in greater detail below, the distance between the substrate and the glow discharge, if that is the source for reactive species, can be adjusted so that the substrate is outside the boundary of the discharge. While there are no quantitative standards for defining such a discharge boundary, visible emission by the discharge is indicative of highly-excited species and, hence, a useful indicator of the level and spatial extent of discharge excitation. Also, system parameters, including pressure and composition of precursor gases and discharge voltage or current, can be adjusted to suppress spontaneous, plasma-mediated deposition on the substrate, thereby effectively isolating the plasma. Confinement of charged species may also be effected by interposing a screen electrode between the source of reactive species, e.g., a self-sustained discharge region, and the substrate. The screen electrode may be externally biased or left floating relative to ground; in either case, the screen electrode prevents passage of ions and electrons through to the substrate, suppressing spontaneous deposition on the substrate surface.

In accordance with one preferred embodiment of the claimed invention, a substrate surface is subjected either to etching or to deposition, primarily as a function of the laser fluence at the irradiated substrate. As is shown in greater detail below, the rate of surface modification (etching or deposition) is generally very sensitive to laser fluence, such that a sharp transition often exists between deposition in one intensity range and etching in another, generally higher intensity range.

A large number of substrate surfaces may be modified in accordance with the present invention, including metals like tungsten and aluminum, semiconductors like gallium arsenide, and insulators like amorphous sapphire ($Al_2O_3$) and pyrex glass.

In accordance with another preferred embodiment of the present invention, reactive species from a remote source are used in combination with a directed laser beam to deposit polycrystalline or epitaxial silicon on a silicon wafer supporting a pre-etched $SiO_2$ layer. Patterned grooves are etched in the layer by conventioal means, e.g., using a photoresist method, and underlying regions of wafer thereby exposed are irradiated by a laser beam in the presence of reactive species, pursuant to the present invention. At laser fluences in excess of about 0.20 J/cm$^2$, epitaxial growth is effected over the exposed regions of the etch pattern only, while below about 0.20 J/cm$^2$, polycrystalline silicon is deposited selectively on the exposed regions of the wafer.

In accordance with yet another preferred embodiment of the present invention, both deposition and etching are carried out in the same reaction environment. In this embodiment, a feature of the present invention is exploited whereby an insulating substrate is etched, in accordance with the present invention, at laser fluences that effect the deposition of epitaxial silicon on conducting and semiconducting substrates. For example, a silicon wafer coated with a thin film of silicon dioxide can be subjected, in the presence of reactive species from a remote source, to high-energy laser pulses in excess of approximately 10 mJ/pulse (laser fluences of about 0.25 J/cm$^2$) to etch the $SiO_2$ coating, until the silicon base is reached. At that point, silicon is deposited within the etched discontinuities or grooves in the coating.

Figure 1:
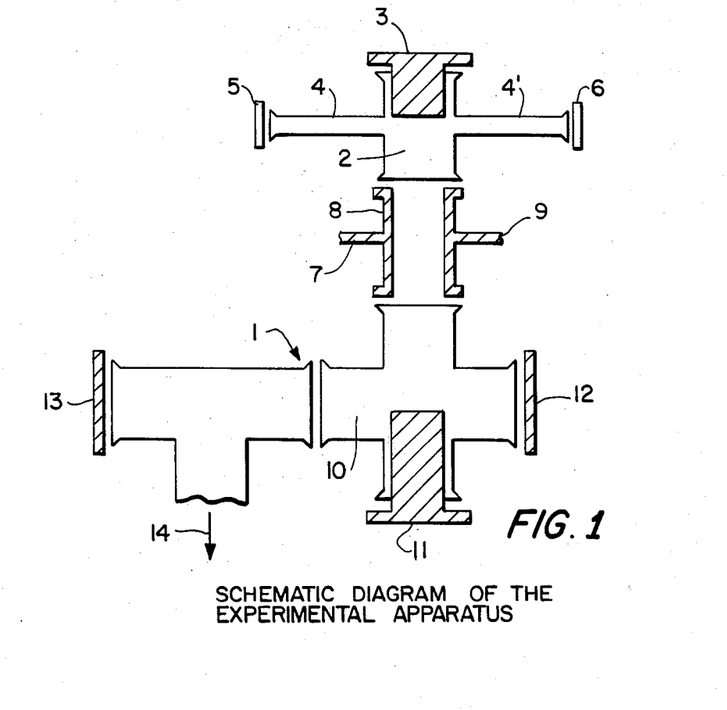
FIG. 1 is a schematic diagram of an apparatus according to one embodiment of the present invention.

Another embodiment of the present invention is illustrated in FIG. 1, which depicts an apparatus for carrying out the above-described surface-modification method. In FIG. 1, longitudinal chamber 2 and transverse chamber 10 are defined by reaction container 1. In a preferred embodiment, container 1 comprises a pyrex glass cross with a 4-inch inner diameter, but the present invention is in no way limited to such a shape or material. An aluminum cathode 3 is disposed at one end of longitudinal chamber 2, and at the other end of longitudinal chamber 2 is disposed anode 11. In between cathode 3 and anode 11, a ring anode 8 is disposed substantially coaxially about longitudinal chamber 2. In the region of ring anode 8, pressure monitors 7 and a gas inlet port 9 are also provided. It is understood, however, that the present invention permits the location of these elements to be altered in light of design or other considerations.

Figure 2:
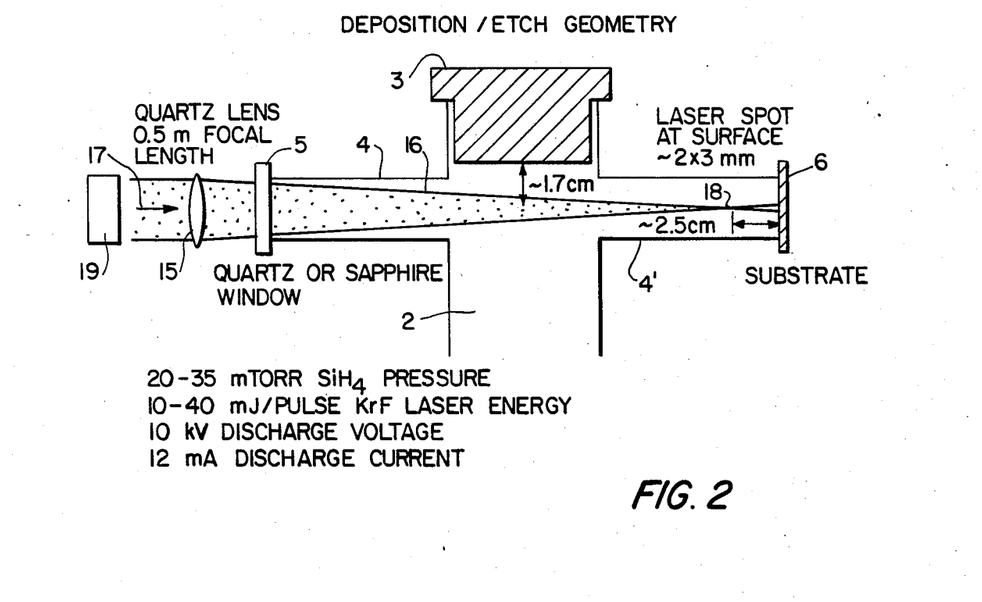
FIG. 2 shows a detailed view of the apparatus of FIG. 1, in the region of the cathode.

Projecting radially outwardly from longitudinal chamber 2 and near cathode 3 are a first and second side ports 4, 4'. Side ports 4, 4' are in communication with longitudinal chamber 2 and extend in opposite directions from each other along a common axis. In a preferred embodiment, side ports 4, 4' comprise an internal diameter of about 1 inch, and the length of second side port 4', measured from the axis of longitudinal chamber 2, is about 20 cm. The distance between cathode 3 and the point of intersection between the axes of longitudinal chamber 2 and ultraviolet beam 16, as shown in FIG. 2, will vary depending upon operational parameters. For example, if the apparatus of FIG. 1 is utilized to sustain an approximately 10 kV plasma discharge, the aforementioned distance may be about 1.7 cm, and the side ports 4, 4' must be positioned accordingly. The apparatus may also be arranged so that UV laser beam 16 (FIG. 2) passes through the top of a negative glow region of the plasma discharge before impinging upon substrate 6.

FIG. 2 shows a schematic diagram of the apparatus of FIG. 1 near the cathode region. A beam of coherent light is generated by a laser source 19, which may comprise a uv excimer laser. Beam 16 propagates in the direction of arrow 17 and is focused by means of quartz lens 15. In a preferred embodiment, lens 15 is a double convex quartz lens with a focal length of 0.5 meters. After lens 15, viewed in the direction of propagation, beam 16 enters side port 4 via a quartz or sapphire uv transparent window 5. Beam 16 is directed through the top of a negative glow region of a plasma discharge sustained at cathode 3 and to a focal point (18) in front of substrate 6. The focal point (18) in the apparatus of FIG. 1 is preferably about 2.5 cm from substrate 6 in order to form a laser spot of about 2×3 mm where the beam 16 impinges upon the surface of substrate 6.

The lengths of side ports 4, 4' are determined in accordance with operational parameters which include the discharge voltage and the extent of the plasma. In general, substrate 6 must be isolated from the self-sustained discharge region in such a way that spontaneous deposition on the substrate is precluded. For a 10 kV glow discharge, for example, a distance of about 20 cm between the substrate and the middle of the cathode (as shown in FIG. 1) is sufficient to suppress significant spontaneous deposition at the surface of the substrate. With a larger discharge voltage, a larger spacing between substrate and cathode could be employed to prevent spontaneous deposition. In addition, gas pressure can be adjusted downward, the composition of the precursor gases altered, or the configuration of the apparatus itself modified to achieve the same result.

By thus eliminating spontaneous plasma deposition of, e.g., silicon, if the glow discharge is sustained in a silane environment, numerous advantages accrue. Because the substrate is not in contact with the plasma, radicals and excited-state species produced in the negative glow region diffuse out to the substrate where they can participate in laser-controlled processing of the substrate. Also, vacuum uv is no longer required, and true control of the processing by the incident laser radiation is achieved, since there is no contact between substrate and plasma. The rate of surface modification is a function of laser fluence, and selection of either deposition or etching may be achieved by simply changing the incident laser intensity.

Figure 3:
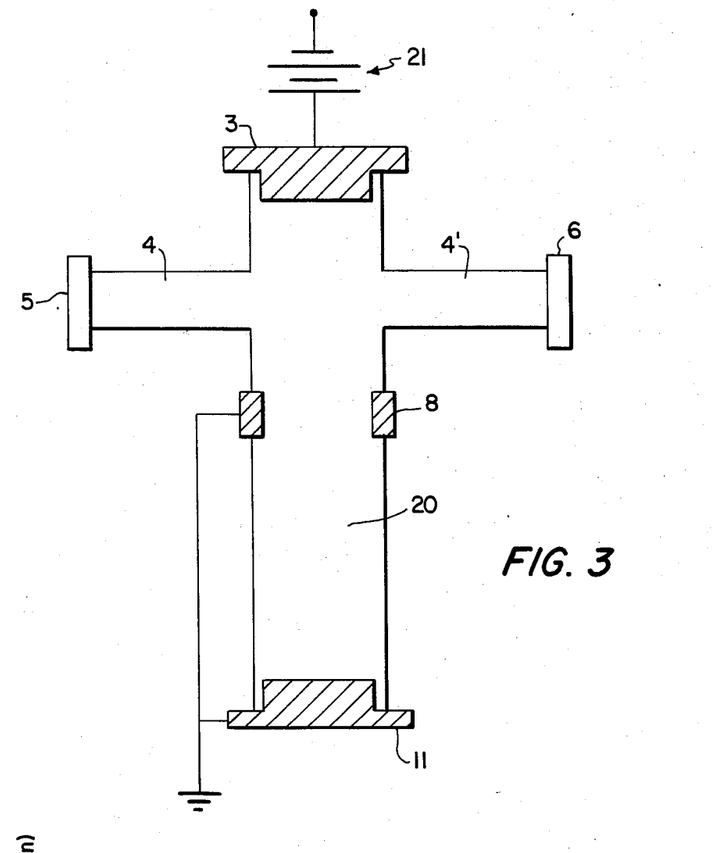
FIG. 3 is a schematic diagram of another apparatus within the present invention.

Another apparatus within the present invention appears in FIG. 3, wherein similar elements are identified as in FIGS. 1 and 2. In FIG. 3, the reaction container essentially defines a single longitudinal chamber 20 having two side ports 4, 4' extending radially therefrom. The cathode region of the apparatus is substantially identical with that illustrated in FIG. 2, with the additional illustration of discharge voltage source 21. Also illustrated in the drawing are grounded ring anode 8 and anode 11. Not illustrated in the figure are means for regulating the gaseous environment of the reaction container and the uv light source, respectively.

In the apparatus shown in FIG. 3, the diameter of longitudinal chamber 20 is about 4 inches and the length of the chamber, i.e., from the inside of cathode 3 to anode 11, is about 17 inches. The inside diameter of side ports 4, 4' is about 1 inch, and the distance between the axis of longitudinal chamber 20 and substrate 6 is about 20 cm. The diameter of the anode is about 3.5 inches.

Figure 6:
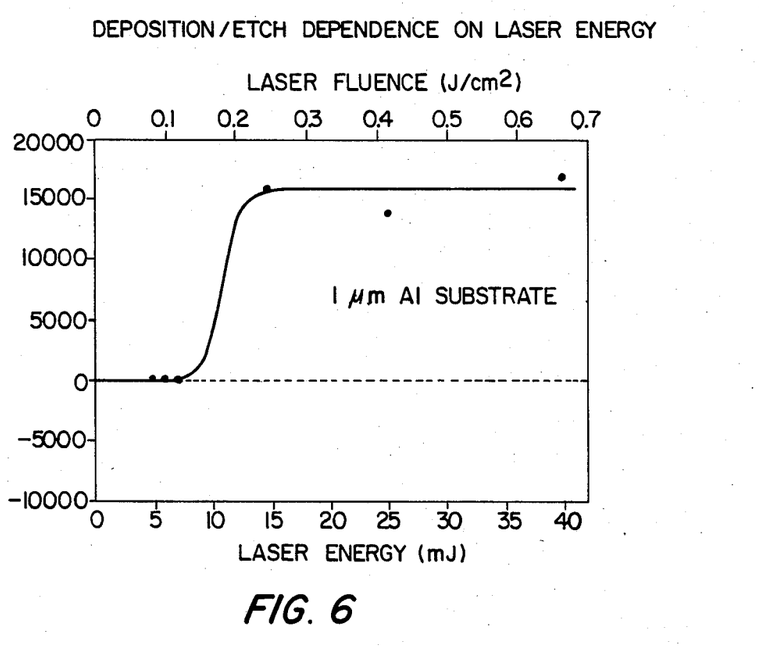
FIG. 6 shows in graph form peak deposition and etch dimensions obtained with the present invention on an aluminum substrate for 17 minutes of irradiation by a KrF laser.
Figure 7:
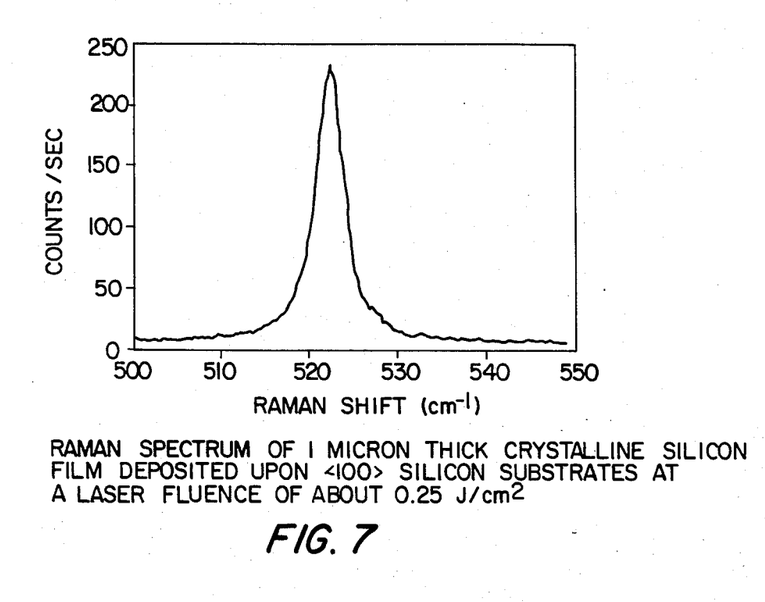
FIG. 7 shows the Raman spectrum for a 1 micron-thick silicon film modified in accordance with the present invention.
Figure 8:
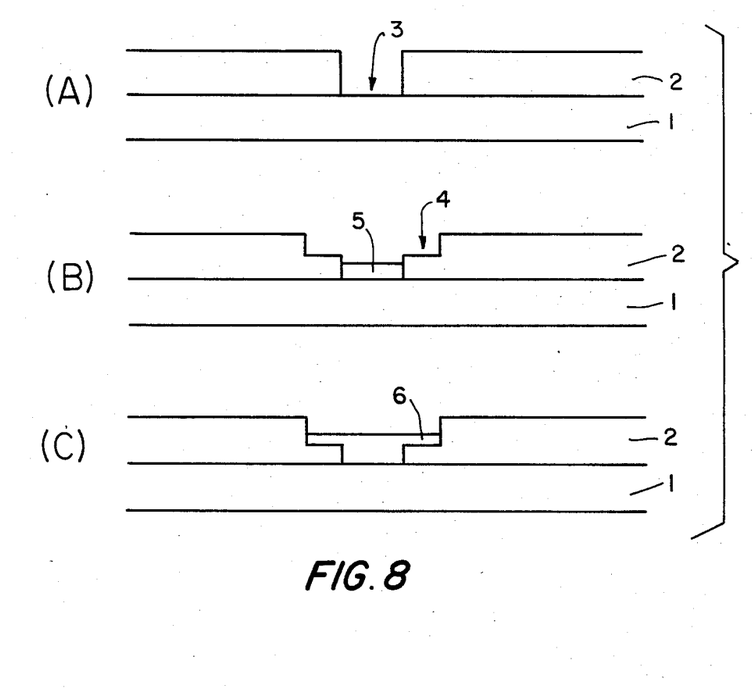
FIG. 8 shows schematically a silicon-on-insulator growth process provided by the present invention.

The negative glow region of a 10 kv dc glow discharge sustained in a 30 mTorr silane environment is situated in the region of cathode 3 and ring anode 8. Ultraviolet light is provided by means of a krypton-fluoride (KrF) excimer laser operating at a wavelength of 248 nm and a pulse repetition rate of 10 Hz (not illustrated in FIG. 6).

The operation of various embodiments within the present invention is now described by reference to the following examples, which are illustrative only.

EXAMPLE 1

An apparatus as shown in FIG. 1 was equipped with a krypton-fluoride excimer laser operating at a wavelength of 248 nm, a pulse repetition rate of 10 Hz, and a pulse length of 12 nsec at full width half maximum (FWHM). The emitted radiation was focused by means of a 0.5 m focal length quartz lens to a spot approximately 2.5 cm in front of the substrate; thereby causing a light spot of approximately 2 mm by 3 mm on the surface of the substrate. A plasma discharge was sustained in electronic grade pure silane injected at a flow rate of about 150 standard cubic centimeters per minute (sccm) at a pressure of 30 mTorr. A glow discharge was maintained by applying 10 kv dc across the cathode and grounded anode. Under these conditions, the discharge current was 12 mA, with an aluminum cathode having a 62 $cm^2$ surface area. The substrate was left at ambient temperature.

The resulting modification of the surface of the substrate was analyzed by scanning electron microscopy (SEM) to determine surface morphology. Cross-sectioned films were examined by transmission electron microscopy (TEM) and laser-Raman spectroscopy to determine the structure of the deposited material. Profiles of the deposited film were measured with a stylus profilometer.

Figure 4:
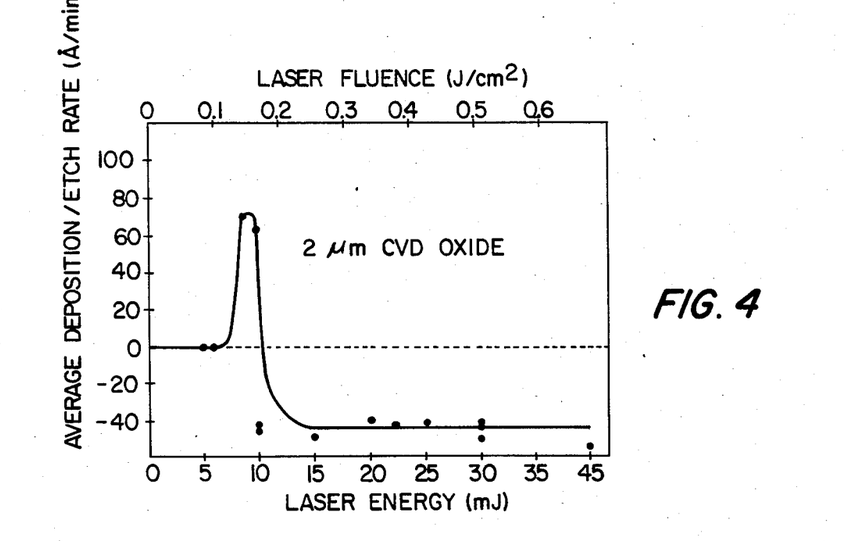
FIG. 4 shows in graph form etch and deposition rates achieved with the present invention, as a function of laser fluence upon, an oxide substrate.

The foregoing analysis showed that the deposition rates obtained in accordance with the process of the present invention are a very sensitive function of the laser fluence at the irradiated substrate. In FIG. 4, the average deposition or etch rate obtained is plotted, as a function of laser fluence, for a 2 micron-thick chemical vapor deposition (CVD) oxide film substrate. Deposition was effected only for laser fluences of from about 0.13 to 0.17 J/cm$^2$. At the upper threshold, a sharp transition to etching was observed, and as can be seen from FIG. 4, the etch rate of the CVD oxide substrate is substantially independent of laser fluence above the threshold energy. Similar dependence of deposition rate on laser fluence was measured for a number of insulator substrates.

Figure 5:
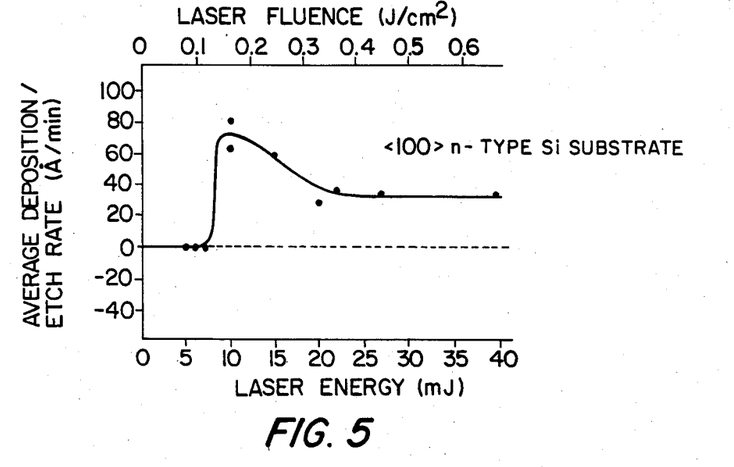
FIG. 5 shows in graph form etch and deposition rates achieved with the present invention, as a function of laser fluence upon, a silicon substrate.

In FIG. 5, rate-versus-fluence curves comparable to those presented in FIG. 4 show the results obtained under the same operating conditions but with (100) n-type silicon substrates. At laser fluences above about 0.17 J/cm$^2$, a surprisingly different effect is obtained. Instead of a sharp transition to etching, a gradual transition to deposition at a lower rate was measured. The reduced deposition rate for laser fluences above about 0.40 J/cm$^2$ is accompanied by dramatic changes in the morphology of the deposited films. It is noted that both the deposition and etch rates saturate at high laser fluences.

The crystal growth rates appear to be constant with respect to time and do not exhibit the saturation effects that have been observed in other laser processing techniques. There is, however, an induction time of about 4.5 minutes after the discharge is initiated before deposition occurs. The length of the induction time is influenced by the cleaning procedure applied to the substrate prior to growth and is apparently associated with a surface treatment by plasma species.

Laser-Raman spectroscopy was used to determine whether a deposited film was amorphous or polycrystalline. The Raman spectra were excited using the 488 nm line from a cw argon-ion laser. For all measurements, the laser was focused to an approximately 100 micron waist at a glancing angle to the film, resulting in an hour-glass shaped sample area about 300 microns long and 100 microns wide. Scattered light was collected at approximately 90° to the beam direction. Spectra were typically recorded with an incident laser power of 20 mW, corresponding to an intensity of about 70 W/cm$^2$, and a spectral resolution of 1 cm$^{-1}$. Absolute line positions were measured to an accuracy of $+0.3$ cm$^{-1}$. This technique was used to characterize the deposited films because it minimizes heating of the film from absorption of the laser beam.

Figure 9:
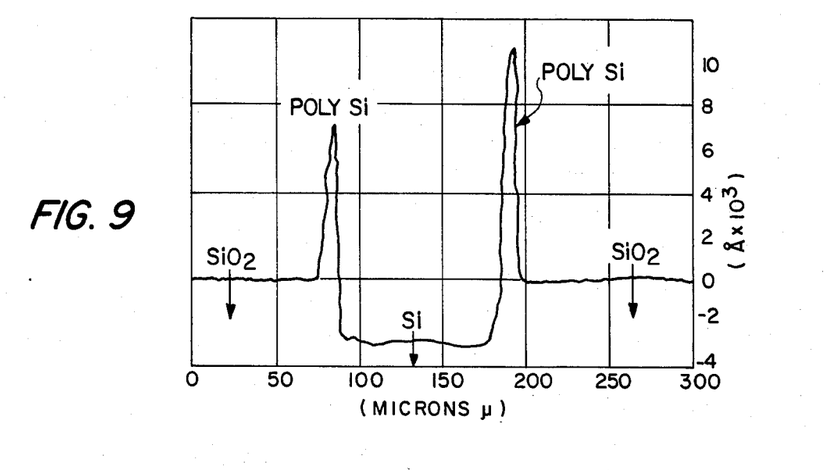
FIG. 9 shows an deposition profile for a preetched substrate surface which was modified in accordance with the present invention.

A representative Raman spectrum from a 1 micron thick film deposited on <100> n-type silicon at a laser fluence of 0.25 J/cm$^2$ is shown in FIG. 9. The dominant feature of the spectrum is the zone-center optical phonon of crystalline silicon at 522.4 cm$^{-1}$ with a linewidth of 3.7 cm$^{-1}$ FWHM. No evidence of the bands associated with amorphous silicon or the Si-H stretch was observed. For comparison, the zone-center optical phonon of the bulk silicon wafer was measured to have a line center frequency of 521.7 cm$^{-1}$ with a linewidth of 3.0 cm$^{-1}$ FWHM. A comparison of the line center frequency and linewidth from the deposited films and the bulk silicon indicates very little stress and defect density in the films deposited on silicon. Similar results were obtained for films deposited on aluminum, quartz, CVD oxide, pyrex, and sapphire for laser fluences between 0.13 and 0.17 J/cm$^2$. Films deposited under these conditions exhibited a 3- to 5-fold enhancement in scattered light intensity over that from bulk silicon. The enhanced scattered light intensity is associated with the rough surface morphology of the deposited films. Small changes in the spatial variation of the line center frequency, linewidth, and scattered light intensity were measured for all deposited films.

Films deposited on <100> n-type silicon at a laser fluence of 0.60 J/cm$^2$ exhibited a line center frequency of 521.9 cm$^{-1}$ with a linewidth of 3.6 cm$^{-1}$, values which are very close to those measured for bulk silicon. In addition, the smooth surface morphology of these films resulted in scattered light intensities which were no more than about 20% higher than those from bulk silicon. A detailed analysis of the lineshape of the 522 cm$^{-1}$ mode indicates that the films deposited at laser fluences between about 0.13 and 0.17 J/cm$^2$ are polycrystalline, while those deposited at laser influences greater than about 0.4 J/cm$^2$ exhibit features associated with monocrystalline silicon.

The physical structure of the deposited films was analyzed by transmission electron microscopy (TEM) of cross-sections cut from the films. A sample was prepared for cross-section analysis by sawing it into thin strips, epoxying the strips into a stack for structural strength, polishing, and finally ion-milling to the desired thickness. The physical structure of the deposited films was found to be a very sensitive function of the laser fluence and the substrate. Films deposited at a laser fluence of 0.15 J/cm$^2$ on aluminum coated silicon wafers were found to be polycrystalline with randomly oriented grains on the order of 1 um in diameter. The films were also found to be permeated with microvoids. The presence of microvoids in fine grained polycrystalline films has also been seen in films deposited using the pulsed-ultraviolet photolysis of silane. The microvoids are attributed to the low average substrate temperature and rapid real-time deposition rate. (See FIG. 6 for results on aluminum substrates).

TEM analysis of films deposited on (100) n-type silicon show a columnar morphology in the polycrystalline region (0.13 to 0.17 J/cm$^2$). TEM micrographs of cross-sectioned films deposited at laser fluences between about 0.4 and 0.6 J/cm$^2$ show no evidence of an interface between the film and the bulk silicon. Micrographs obtained in this region show a smooth surface permeated by surface waves with an amplitude and period of about 20 nm and about 100 nm, respectively. The waves are similar to those observed in pulsed laser annealing experiments. Material deposited in this region produced an electron diffraction pattern identical to that of the bulk silicon substrate.

EXAMPLE 2

Silicon-on-insulator (SOI) growth experiments were performed using a silicon wafer carrying either a 1 micron- or 2 micron-thick silicon dioxide film, into which 100 micron lines had been etched by conventional means to expose the silicon surface beneath. The same apparatus and operating conditions as in Example 1 were employed.

Figure 10:
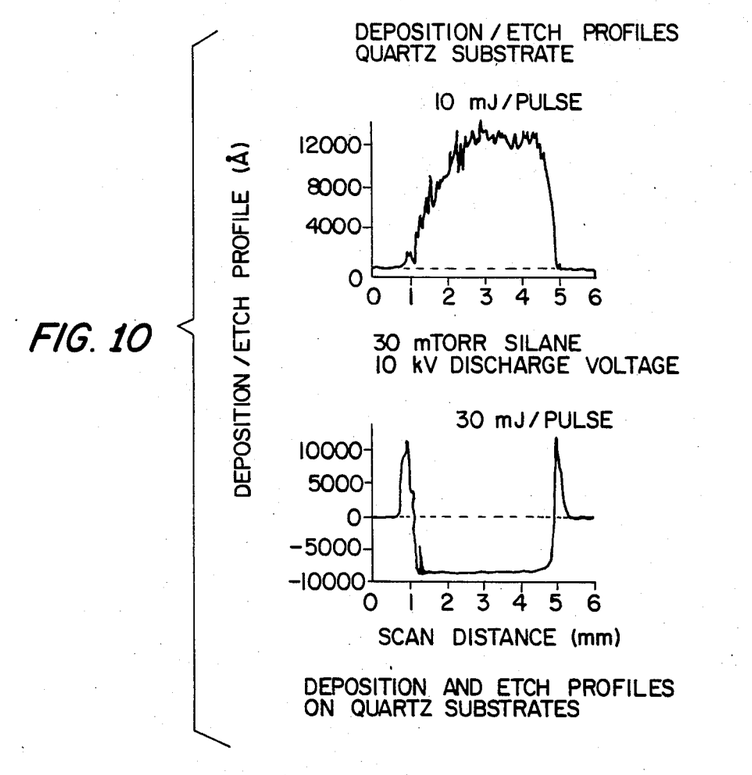
FIG. 10 shows deposition and etch profiles on quartz substrates.

The exposed silicon surface acts as a nucleation region ("seed") for epitaxial growth. The basic SOI growth process is illustrated in FIG. 10. Shown schematically in FIG. 10A is a silicon layer 1 with an SiO$_2$ coating 2. In seed region 3, the oxide has been etched to leave exposed silicon for crystal growth. Exposure of the substrate illustrated in FIG. 10A to the laser/plasma process of the present invention etches the oxide in region 4 and deposits epitaxially grown silicon 5 in seed region 3 as illustrated in FIG. 10b. In FIG. 10C, lateral epitaxial silicon growth has resulted in silicon on insulator 6.

In FIG. 11, the profilometer profile of a typical SOI surface modified in accordance with the present invention is shown. Silicon grown epitaxially from the seed region (i.e., up from the exposed wafer surface) some 5000 angstroms further down appears in an etched groove between the points corresponding, respectively, to about the 85- and 180-micron points of the surface sweep. The edges of the epitaxial region are apparently delimited by faster growing polycrystalline region, which may be due to the sidewalls of the etched oxide providing an uncertain nucleation environment for epitaxy. If so, the use of an anisotropic etch to pattern the oxide layer should inhibit development of the polycrystalline regions.

EXAMPLE 3

Deposition and etch profiles were determined for films produced in the apparatus illustrated in FIG. 1. Deposition and etch profiles obtained on quartz substrates at laser energies of 10 mJ/pulse and 30 mJ/pulse are shown in FIG. 12. The asymmetric silicon deposition profile obtained at 10 mJ/pulse was caused by the asymmetric laser beam profile and indicates the linearity of deposition achieved with the instant invention. The anisotropic etch profile obtained at 30 mJ/pulse is characterized by steep sidewalls and a flat bottom. The silicon deposition which occurs at the edges of the etch profile is also caused by the asymmetric laser beam profile. The relatively steep sidewalls observed in the etch profile indicate the sharp threshold for the transition from deposition to etching.

The deposition and etch profiles shown in FIG. 12 were obtained with the laser and plasma operating for a time duration of 17 min, resulting in average deposition and etch rates of about 80 nm/min and about 50 nm/min, respectively. Film characterization by laser Raman spectroscopy, transmission electron microscopy, and scanning electron microscopy shows that the films deposited on the quartz substrate were polycrystalline silicon with average grain sizes of from about 200 nm to 600 nm.

What is claimed is:

1. A process for modifying a surface of a substrate, comprising the steps of:
   (a) generating radical species of a defined source;
   (b) allowing the radical species to diffuse to a substrate surface which is remote from said defined source, the concentration of species at said surface being insuffient to cause spontaneous surface modification; and
   (c) in the presence of the radical species, contacting at least a portion of said substrate surface with a beam of light having a predetermined intensity,
   whereby said surface undergoes modification only in in said portion contacted by said light.

2. A process according to claim 1, wherein said defined source comprises a direct current glow discharge plasma.

3. A process according to claim 1, wherein said defined source comprises a radio frequency discharge plasma.

4. A process according to claim 1, wherein said defined source comprises means for directing radiation against material of predetermined composition, whereby said reactive species are produced, said radiation comprising a laser beam or an electron beam.

5. A process according to claim 2, wherein said plasma is comprised of species derived from silane at said defined source.

6. A process according to claim 5, wherein said silane is at a pressure of approximately 30 mTorr.

7. A process according to claim 1, wherein said beam of light is coherent.

8. A process according to claim 7, wherein said wavelength falls in the range between about 248 nm and 351 nm.

9. A process according to claim 8, wherein said beam of coherent light is produced by a UV-emitting excimer laser.

10. A process according to claim 1, wherein said substrate comprises an oxide.

11. A process according to claim 10, wherein said substrate comprises one selected from the group consisting of pyrex glass, sapphire, and silicon dioxide.

12. A process according to claim 1, wherein said modification comprises etching of said surface.

13. A process according to claim 1, wherein said modification comprises deposition of a layer on said surface.

14. A process according to claim 13, wherein said layer comprises silicon.

15. A process according to claim 14, wherein said silicon is epitaxial.

16. A process according to claim 1, wherein said modification comprises:
   (a) etching discontinuities in said substrate and
   (b) depositing material in said discontinuities.

17. A process according to claim 1, wherein said substrate is subjected to a preetch to produce discontinuities in said substrate and wherein said modification comprises depositing epitaxial silicon in said discontinuities.

18. An apparatus for modifying a surface of a substrate, comprising:
   (a) generating means for generating reactive species;
   (b) irradiating means for producing and directing a beam of light;
   (c) holding means for holding a substrate:
      exposed to said reactive species but spaced therefrom a sufficient distance to preclude spontaneous modification, and
      accessible to said beam of light; and
   (d) conduit means for allowing diffusion of said reactive species from said generating means to said substrate.

19. An apparatus according to claim 18, wherein said generating means comprises:
   (i) a reaction space containing at least one gas,
   (ii) means for introducing and removing gas from said reaction space, and
   (iii) a cathode and at least one anode arranged such that a voltage potential can be imposed across at least a portion of said reaction space of sufficient magnitude such that said gas is ionized.

20. An apparatus according to claim 19, wherein said voltage potential alternates at a frequency in the radio wave range.

21. An apparatus according to claim 18, wherein said generating means comprises:
   (i) a reaction space containing at least one gas,
   (ii) means for introducing and removing gas from said reaction space, and (iii) means for inducing a magnetic field in at least a portion of said reaction space of sufficient magnitude such that said gas is heated to form a plasma.

22. An apparatus according to claim 18, wherein said generating means comprises:
(i) means for producing a beam comprised of electrons or coherent light, and
(ii) means for directing said beam at a predetermined target.

23. An apparatus according to claim 19, wherein said conduit means comprises a first tube, one end of which communicates with said reaction space, said substrate being disposed at the other end of said tube.

24. An apparatus according to claim 23, wherein said irradiating means comprises a second tube, one end of which communicates with said reaction space, said first and second tubes being arranged opposite each other along a common longitudinal axis which passes through said reaction space.

25. An apparatus according to claim 24, wherein said irradiating means further comprises a window disposed at the end of said second tube opposite said end which communicates with said reaction space, said window transmitting at least ultraviolet light.

26. An apparatus according to claim 25, wherein said window is comprised of one from the group consisting of quartz and sapphire.

27. An apparatus according to claim 18, wherein said irradiating means comprises a ultraviolet-emitting excimer laser.

* * * * *